US012785364B2

(12) United States Patent
Chetrit et al.

(10) Patent No.: US 12,785,364 B2
(45) Date of Patent: Nov. 3, 2026

(54) SEMICONDUCTOR OPTICAL AMPLIFIER

(71) Applicant: DustPhotonics, Modiin (IL)

(72) Inventors: Yoel Chetrit, Kfar Ben Nun (IL); Shmuel Borenstain, Modiin (IL)

(73) Assignee: Dust Photonics, Modiin (IL)

( * ) Notice: Subject to any disclaimer, the term of this patent is extended or adjusted under 35 U.S.C. 154(b) by 368 days.

(21) Appl. No.: 18/640,117

(22) Filed: Apr. 19, 2024

(65) Prior Publication Data

US 2025/0329993 A1 Oct. 23, 2025

Related U.S. Application Data

(60) Provisional application No. 63/486,242, filed on Feb. 21, 2023.

(51) Int. Cl.
*H01S 5/50* (2006.01)
*H01S 5/026* (2006.01)
*H01S 5/10* (2021.01)

(52) U.S. Cl.
CPC ................ *H01S 5/50* (2013.01); *H01S 5/026* (2013.01); *H01S 5/1082* (2013.01)

(58) Field of Classification Search
CPC . H01S 5/50; H01S 5/026; H01S 5/101; H01S 5/1032; H01S 5/1082; H01S 3/94049; H01S 3/2333; H01S 3/2316; H01S 3/10023; H01S 3/0612; H01S 3/0606; H01S 3/042; B33Y 30/00; B33Y 40/00; B22F 10/28; B22F 12/49; B29C 64/246; Y02P 10/25
USPC .......................................................... 359/344
See application file for complete search history.

(56) References Cited

U.S. PATENT DOCUMENTS 5,592,503 A * 1/1997 Welch ....................... H01S 5/20 372/50.11
6,822,787 B1 * 11/2004 DiJaili ................ H01S 5/18311 359/344
11,848,535 B1 * 12/2023 Doerr ..................... H04B 10/40

* cited by examiner

*Primary Examiner* — Melissa J Koval
(74) *Attorney, Agent, or Firm* — Reches Patents

(57) ABSTRACT

A SOA that includes a SOA input optical port, a first region, a mirror, a second region and a SOA output optical port. At least one of the first region and the second region is an active region configured to amplify an optical signal. The SOA input optical port, the first region, the mirror, the second region, and the SOA output optical port are in optical communication with each other. The SOA input optical port and the SOA output optical port are located at a first facet of the SOA. The first region and the second region are oriented to each other, and are oriented to the first facet of the SOA.

20 Claims, 5 Drawing Sheets

SEMICONDUCTOR OPTICAL AMPLIFIER

BACKGROUND OF THE INVENTION

A semiconductor optical amplifier (SOA) amplifies an input optical signal to provide an output optical signal.

A prior art SOA has a box shape and had a SOA input optical port (for receiving the input optical signal) at one facet and a SOA output optical port (for outputting the output optical signal) at an opposite facet.

The SOA was usually inserted into a cavity formed in a silicon chip and had to be optically coupled to ports of the silicon chip. The SOA input optical port should have been optically coupled to an output port formed at one sidewall of the cavity, and the SOA output optical port should have been optically coupled to an input port formed at an opposite sidewall of the cavity.

In order to provide a desired optical coupling, the SOA input optical port should have been very close (and even form contact with) the output port formed at the one sidewall of the cavity, and the SOA output optical port should have been very close (and even form contact with) the input port formed at the opposite sidewall of the cavity.

SOAs are diced using a process of a limited accuracy-which resulted at a large tolerance of the distance between the SOA input optical port and the SOA output optical port—which prevented to obtain the desired optical coupling.

U.S. Pat. No. 7,561,765 attempted to position the SOA input optical port and the SOA output optical at the same plane—using a U-shaped passive waveguide—but the U-shaped passive waveguide is passive, is not compact, and is associated with large attenuation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawing in which:

DETAILED DESCRIPTION OF THE DRAWINGS

There is provided an SOA that includes a SOA input optical port, a first active region, a mirror, a second active region, and a SOA output optical port.

The SOA includes linear regions that exhibits a low loss, and low attenuation. Any bending or angular adjustment may be implemented in another chip that may be implemented in silicon—and not in III-V compounds from which the SOA is made.

A III-V compound is a chemical compound that includes at least one group III element (Boron, Aluminum, Gallium, Indium, Thallium) at least one group V element (Nitrogen, Phosphorus, Arsenic, Antimony, Bismuth).

While the SOA (that includes III-V compounds) suffers from a small and problematic diffraction difference between the core of a waveguide and the clot surrounding the waveguide—this problem does not exist in the other chip—which may include curves waveguides without loss—or at least without the losses associated with curved waveguides in the SOA.

The SOA input optical port, first active region, mirror, second active region, and the SOA output optical port are in optical communication with each other.

Each one of the SOA input optical port and the SOA output optical port is located at a first facet of the SOA.

The first active region and the second active region are oriented to each other—and are oriented to the first facet of the SOA. The latter orientation reduces gain ripple.

According to an embodiment, the first active region and the second active region are oriented to each other by a tile angle that may range between 10-170, between 20 to 60 or between any sub range of 1-179 degrees.

Figure 1:
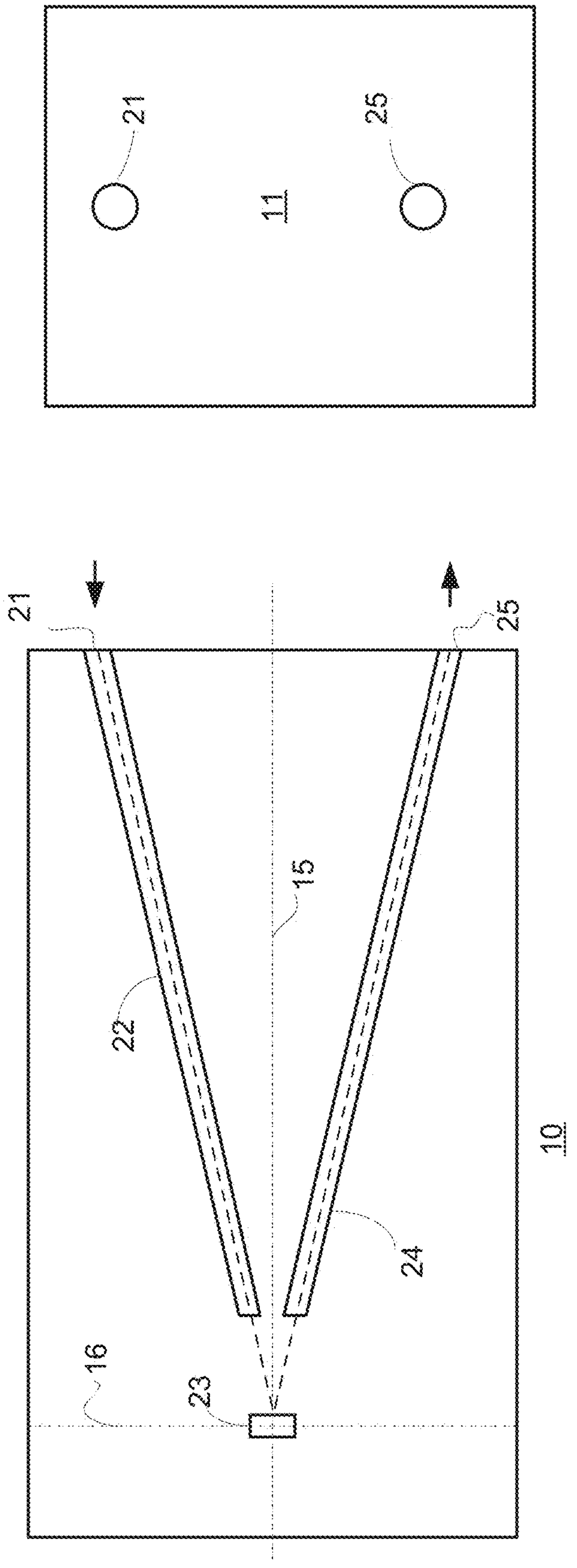
FIG. 1 illustrates an example of an SOA.

Referring to FIG. 1—the first active region 22 and the second active region 24 may be substantially symmetrical about an axis of symmetry 15 that may be a longitudinal axis of the SOA. The substantial symmetry may allow a deviation of less than an angle or up to few angles (for example up to 1, 5, 10 15 degrees and the like)—although the most effective configuration may require a full symmetry.

An SOA input optical port 21 may be a beginning of the first active region. The second active region may end at the SOA output optical port 25.

The SOA input optical port may receive the input optical signal and the first active region may be configured to amplify the input optical signal to provide a first amplified optical signal.

The mirror may receive the first amplified optical signal and reflect the first amplified optical signal towards the second active region to provide a reflected optical signal.

The second active region may receive the reflected optical signal and amplify the reflected optical signal to provide a second amplified optical signal.

The second amplified optical signal may be outputted from the SOA output optical port.

The SOA input optical port and the SOA output optical port are located at the first fact—which allows an accurate interface with a silicon wafer.

The suggested SOA can be very compact—and may include active regions—and is not limited by various limitations associated with the mentioned above prior art SOAs.

The SOA may include one or more electrodes for supplying electrical power required for the amplification. The one or more electrodes may be located in any location—for example at opposite facets of the SOA, at the same facet, and the like.

The SOA may include anti-reflective coatings—for example—in proximity to the SOA input optical port and/or to the SOA output optical port.

The mirror may extend along an entire SOA (for example along the entire transversal axis (denoted 15 in FIG. 1) of the SOA—or along only a part of the transversal axis.

The mirror may be formed by etching and coating the exposed plane with a reflecting material.

FIG. 1 illustrates a SOA in which there is a gap between the mirror 23 and each one of the first active region 22 and the second active region 24. The mirror 23 can be designed as a focusing curved mirror which can focus the light from the first active region 22 to the second active region 24.

The first active region and the second active region may be waveguides.

Figure 2:
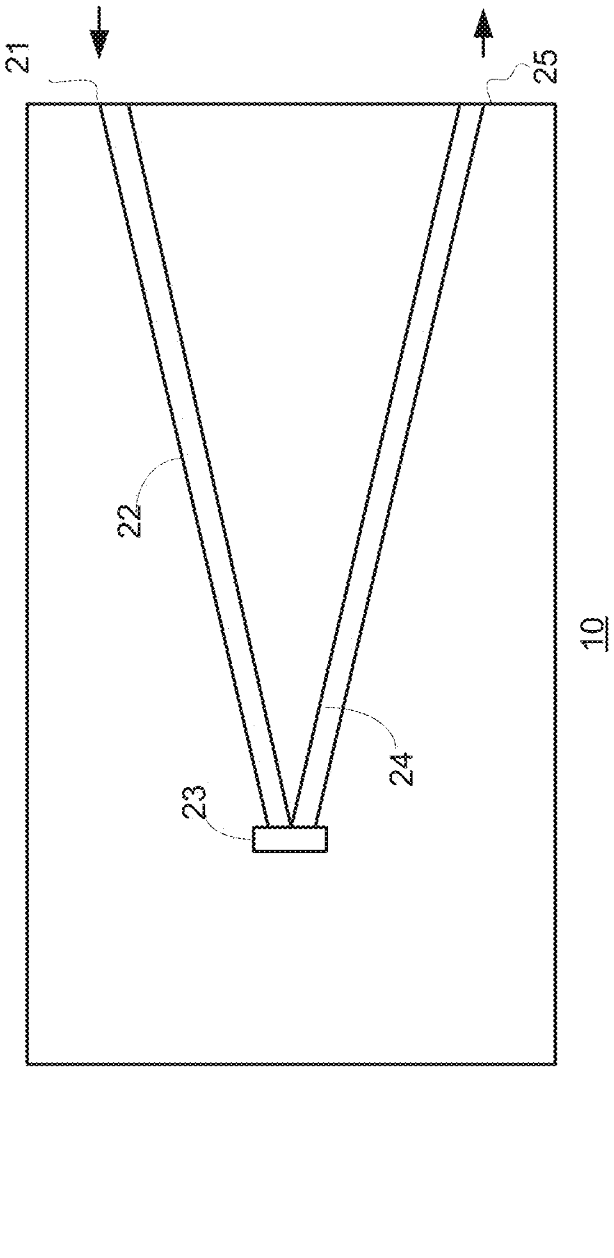
FIG. 2 illustrates an example of an SOA.

In FIG. 2 there is no gap between mirror 23 and the first and second active regions. In practical deign the Gap should be very small (for example—less than a micron to minor the optical insertion loss of the waveguide on the first and second active regions.

Figure 3:
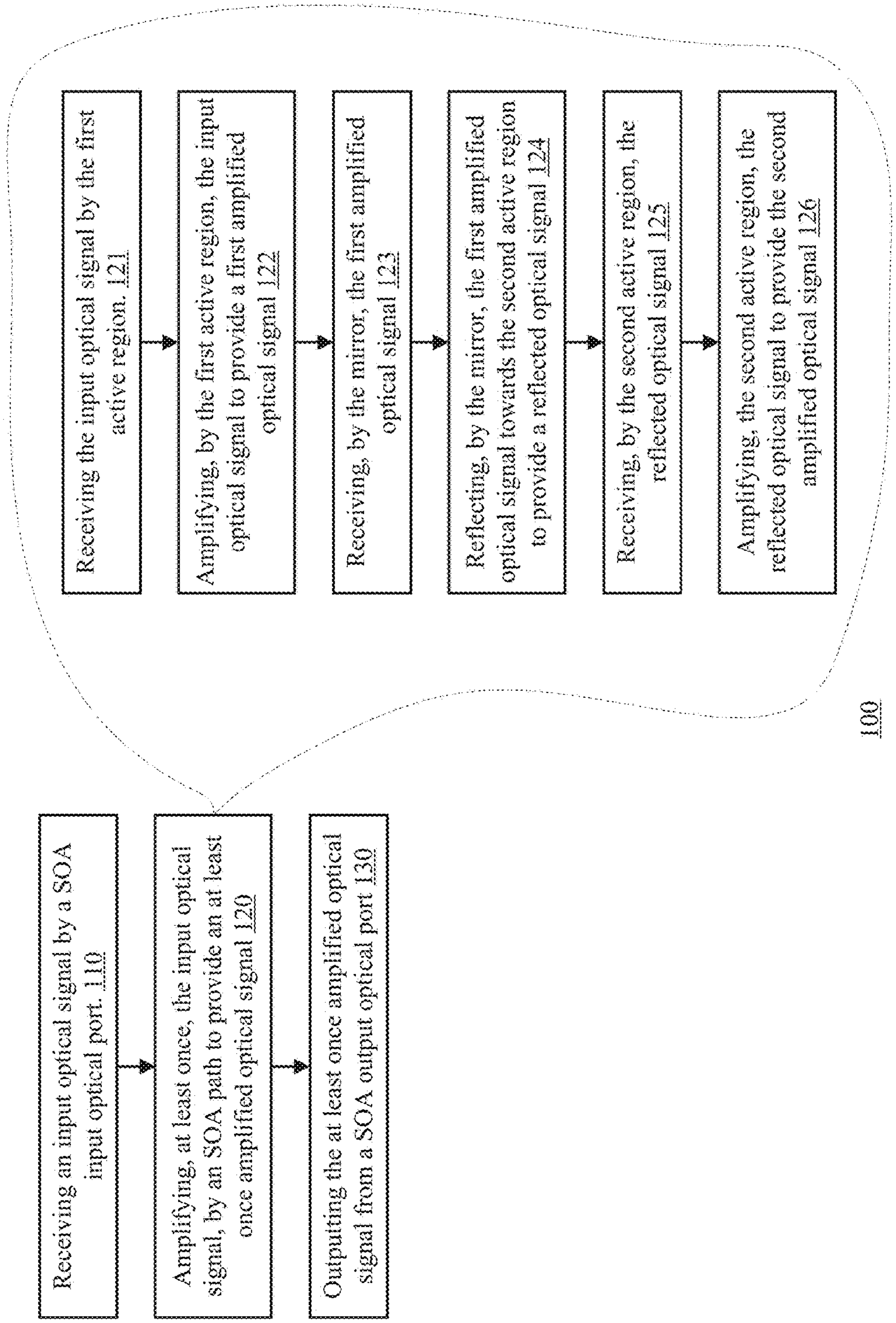
FIG. 3 is an example of a method.

FIG. 3 illustrates an example of method 100 for amplifying an input optical signal.

According to an embodiment, method 100 includes step 110 of receiving an input optical signal by a semiconductor optical amplifier (SOA) input optical port.

According to an embodiment, step 110 is followed by step 120 of amplifying, at least once, the input optical signal, by an SOA path to provide an at least once amplified optical signal.

According to an embodiment, step 120 is followed by step 130 of outputting the at least once amplified optical signal from a SOA output optical port.

According to an embodiment, the SOA path includes a first region, a mirror and a second region. At least one of the first region and the second region is an active region configured to amplify an optical signal. The SOA input optical port, the first region, the mirror, the second region, and the SOA output optical port are in optical communication with each other. The SOA input optical port and the SOA output optical port are located at a first facet of the SOA. The first region and the second region are oriented to each other and are oriented to the first facet of the SOA.

According to an embodiment, the first region is a first active region and the second region is a second active region, wherein the at least once amplified optical signal is a second amplified optical signal.

According to an embodiment, step 120 includes:

a. Step 121 of receiving the input optical signal by the first active region.
b. Step 122 of amplifying, by the first active region, the input optical signal to provide a first amplified optical signal.
c. Step 123 of receiving, by the mirror, the first amplified optical signal.
d. Step 124 of reflecting, by the mirror, the first amplified optical signal towards the second active region to provide a reflected optical signal.
e. Step 125 of receiving, by the second active region, the reflected optical signal.
f. Step 126 of amplifying, the second active region, the reflected optical signal to provide the second amplified optical signal.

Figure 4:
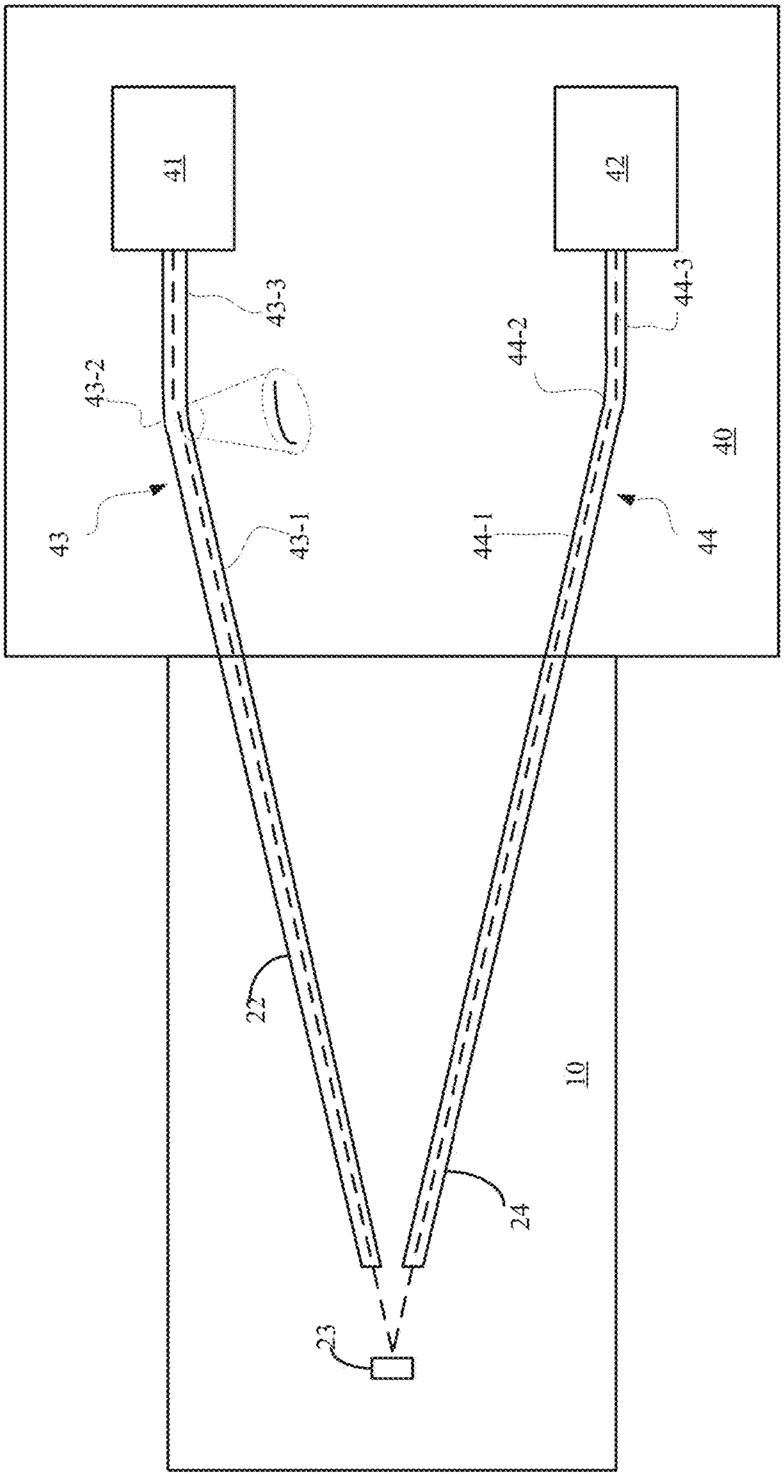
FIG. 4 illustrates an example of an SOA and another chip.

FIG. 4 illustrates an example of the SOA and another chip 40 that includes a laser source 41, a first waveguide 43, a second waveguide 44, and a photonic integrated circuit (PIC) 42.

According to an embodiment, the other chip 40 is formed by elements other than III-V compounds.

The first waveguide 43 optically couples the laser source 41 to the first region.

The first waveguide includes a first proximal waveguide segment 43-1 having an orientation that substantially equals the orientation of the first region, a first distal waveguide segment 43-2 and a first intermediate waveguide segment 43-2 that may be curved and/or may not be curved—for compensating for the different angles of the first proximal waveguide segment 43-1 and the first distal waveguide segment 43-2. Alternatively, there may be more first waveguide segments. Alternatively, the entirety of the first waveguide is curved.

The first waveguide 43 optically couples the second region to the PIC 42.

The second waveguide includes a second proximal waveguide segment 44-1 having an orientation that substantially equals the orientation of the second region, a second distal waveguide segment 44-2 and a second intermediate waveguide segment 44-2 that may be curved and/or may not be curved—for compensating for the different angles of the second proximal waveguide segment 44-1 and the second distal waveguide segment 44-2. Alternatively, there may be more second waveguide segments. Alternatively, the entirety of the second waveguide is curved.

The SOA may have a length within the millimetric range (for example between 1-20 millimeters and have a much smaller width (for example between 5-30 percent of the length).

According to an embodiment the SOA operates at wavelengths that may range between 1280 and 1350 nanometers.

In a further embodiment the SOA chip are designed to the C band (1500-1600 nm) and O band (1260-1360 nm).

Figure 5:
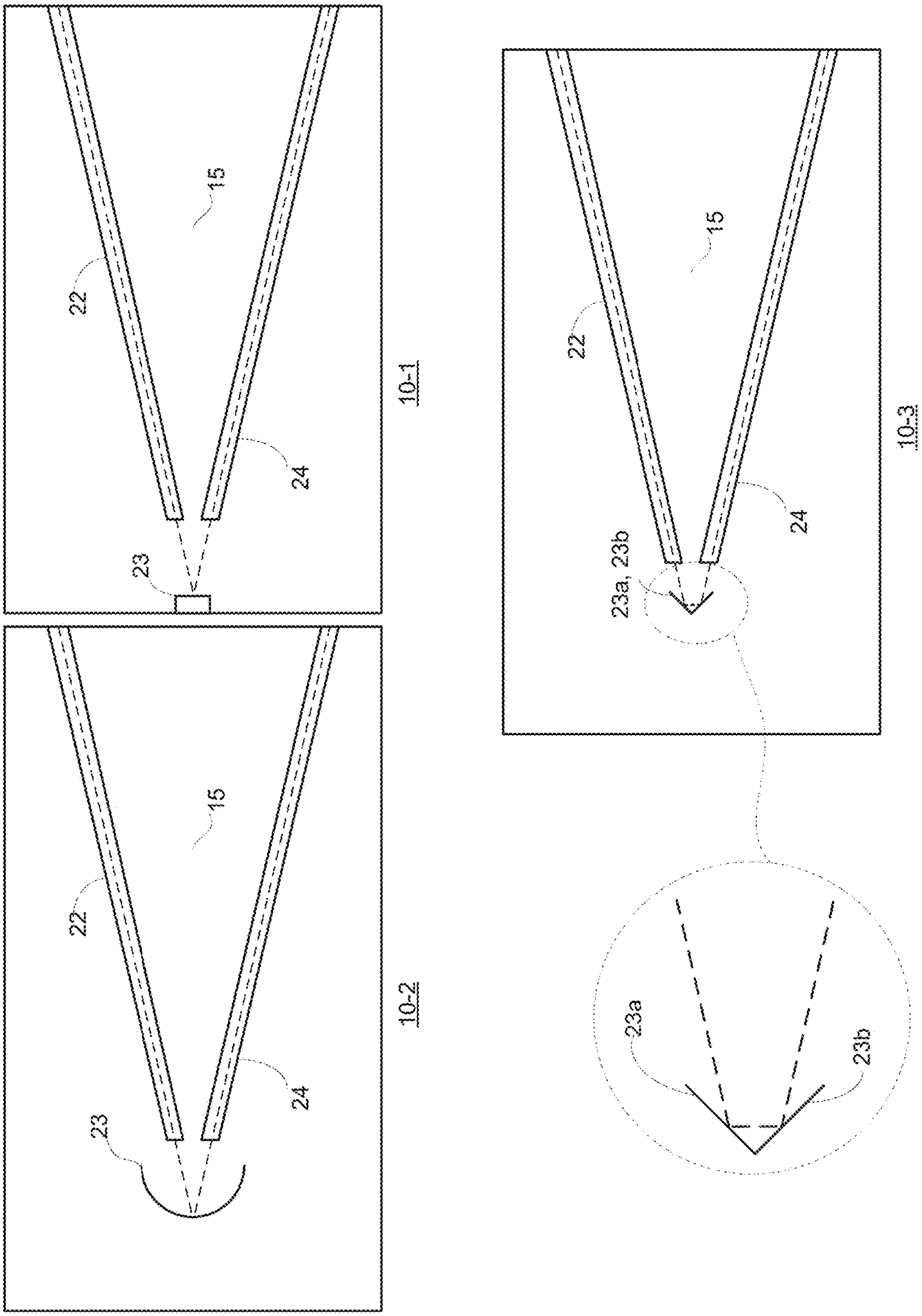
FIG. 5 illustrates examples of SOAs.

FIG. 5 illustrates examples of SOAs 10-1, 10-2 and 10-3.

The mirror 23 of SOA 10-1 is located at the edge of the SOA. In this case the edge may be covered by a high reflective mirror.

The mirror of SOA 10-2 is curved where the in and out waveguide output port 22 and 24 are located at the mirror focal point. This enable to increase the effective WVG-mirror gap.

The mirror of SOA-103 is a TIR mirror. Where in this case the angle between the in out waveguides and the angle between the two mirror parts 23*a* and 23*b* is design to be equal or large with respect the TIR angle between considering the mirror dielectric constant and the surrounding dielectric material.

Although SOAs 10-1, 10-2 and 10-3 are illustrated as including gap between the mirror and the first and second regions—there may not be such a gap—as illustrated in FIG. 2.

In the foregoing detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter being regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using microelectronics and/or optical components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A semiconductor optical amplifier (SOA), comprising:
- a SOA input optical port;
- a first region;
- a mirror;
- a second region;
- wherein at least one of the first region and the second region is an active region configured to amplify an optical signal; and
- a SOA output optical port;
- wherein the SOA input optical port, the first region, the mirror, the second region, and the SOA output optical port are in optical communication with each other;
- wherein the SOA input optical port and the SOA output optical port are located at a first facet of the SOA; and
- wherein the first region and the second region are oriented to each other and are oriented to the first facet of the SOA.

2. The SOA according to claim 1, wherein the first region is a first active region, and the second region is a second active region.

3. The SOA according to claim 2, wherein the first active region and the second active region are substantially symmetrical about an axis of symmetry.

4. The SOA according to claim 3, wherein the axis of symmetry is a longitudinal axis of the SOA.

5. The SOA according to claim 2, wherein the input optical port is a beginning of the first active region.

6. The SOA according to claim 2, wherein the second active region ends at the SOA output optical port.

7. The SOA according to claim 2, wherein the input optical port is configured to receive the input optical signal, the first active region is configured to amplify the input optical signal to provide a first amplified optical signal.

8. The SOA according to claim 7, wherein the mirror is configured to receive the first amplified optical signal and reflect the first amplified optical signal towards the second active region to provide a reflected optical signal.

9. The SOA according to claim 8, wherein the second active region is configured to receive the reflected optical signal and amplify the reflected optical signal to provide a second amplified optical signal.

10. The SOA according to claim 9, wherein the SOA output optical port is configured to output the second amplified optical signal.

11. The SOA according to claim 2, further comprising one or more electrodes for supplying electrical power required for the amplification.

12. The SOA according to claim 2, wherein the mirror extends along the entire SOA.

13. The SOA according to claim 2, wherein the mirror extends along only a part of the SOA.

14. The SOA according to claim 2, wherein the mirror is formed by etching and coating an exposed plane with a reflecting material.

15. The SOA according to claim 2, wherein the first active region and the second active region are oriented to each other by a tilt angle that ranges between 20 to 60 degrees.

16. The SOA according to claim 2, wherein there is a gap between the mirror and each one of the first active region and the second active region.

17. The SOA according to claim 1, wherein only one region of the first region and the second region is an active region.

18. The SOA according to claim 1, wherein the mirror is curve mirror.

19. The SOA according to claim 1, wherein the mirror is a total internal reflection (TIR) mirror.

20. A method for amplifying an input optical signal, the method comprises:

receiving an input optical signal by a semiconductor optical amplifier (SOA) input optical port;

amplifying, at least once, the input optical signal, by an SOA path to provide an at least once amplified optical signal; and outputting the at least once amplified optical signal from a SOA output optical port;

wherein the SOA path comprises a first region, a mirror and a second region;

wherein at least one of the first region and the second region is an active region configured to amplify an optical signal;

wherein the SOA input optical port, the first region, the mirror, the second region, and the SOA output optical port are in optical communication with each other;

wherein the SOA input optical port and the SOA output optical port are located at a first facet of the SOA; and wherein the first region and the second region are oriented to each other and are oriented to the first facet of the SOA.

* * * * *